United States Patent [19]

Steinberg

[11] Patent Number: 5,372,674
[45] Date of Patent: Dec. 13, 1994

[54] ELECTRODE FOR USE IN A PLASMA ASSISTED CHEMICAL ETCHING PROCESS

[75] Inventor: George Steinberg, Westport, Conn.

[73] Assignee: Hughes Aircraft Company, Los Angeles, Calif.

[21] Appl. No.: 189,262

[22] Filed: Jan. 28, 1994

Related U.S. Application Data

[63] Continuation of Ser. No. 62,087, May 14, 1993, abandoned.

[51] Int. Cl.$^5$ ........................ H01L 21/306; B44C 1/22
[52] U.S. Cl. ..................... 156/643; 156/657; 156/345
[58] Field of Search ............... 156/643, 646, 657, 662, 156/345; 204/192.32, 192.37, 298.31, 298.33, 298.34; 219/121.4, 121.41; 118/723 E, 723 ER, 723 I

[56] References Cited

U.S. PATENT DOCUMENTS 4,270,999  6/1981  Hassan .................. 204/298.33 X
4,590,042  5/1986  Drage .................... 204/298.33 X

OTHER PUBLICATIONS

Rapid, Noncontact Optical Figuring of Asphehric Surfaces With Plasma-Assisted Chemical Etching, D. L. Bollinger, G. M. Gallatin, J. Samuels, G. Steinberg, C. B. Zarowin, Hughes Danbury Optical Systems, Inc., from SPIE vol. 1333 Advanced Optical Manufacturing and Testing (1990), pp. 2–14.

Primary Examiner—William Powell
Attorney, Agent, or Firm—Michael W. Sales; Wanda K. Denson-Low

[57] ABSTRACT

The electrode (11) of the present invention is used in a Plasma Assisted Chemical Etching process and comprises an inner member (47) surrounded by an outer member (45) defining a gap (77) therebetween such that a gas can flow therethrough. In the preferred embodiment, the inner member (47) and the concentric outer member (45) are both cylindrical in shape, therefore, the gap (77) has an annular configuration. A vertical ducting system is bored within the inner member (47) and directly or indirectly intersects the annular gap (77).

26 Claims, 4 Drawing Sheets

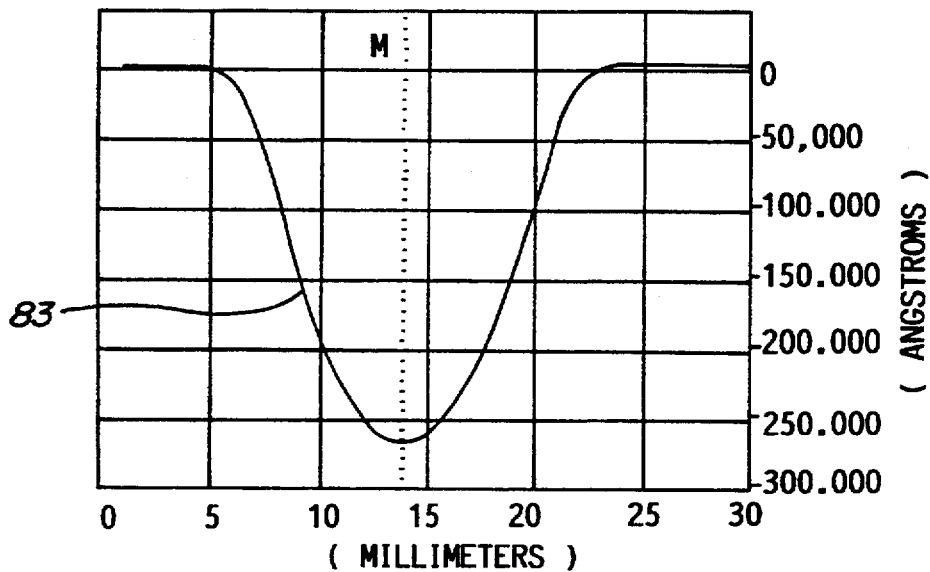
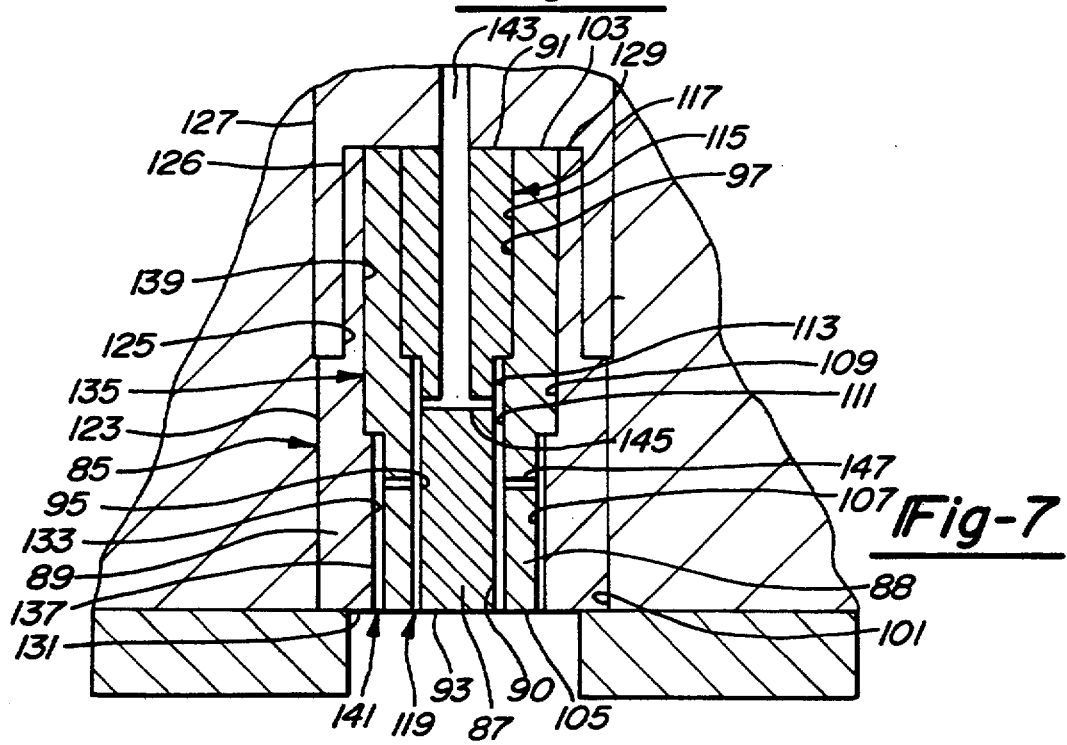

ELECTRODE FOR USE IN A PLASMA ASSISTED CHEMICAL ETCHING PROCESS

This is a continuation of application Ser. No. 08/062,087, filed May 14, 1993, now abandoned.

BACKGROUND OF THE INVENTION

1. Field of the Invention

This invention relates generally to an electrode for use in a Plasma Assisted Chemical Etching process and specifically an electrode having an inner member surrounded by an outer member such that an annular gap is formed therebetween.

2. Discussion

The computer and electronic device industries have become increasing competitive thereby necessitating that integrated circuits, used within these devices, be lower in cost and of higher quality. In particular, silicon wafer substrates, upon which the integrated circuitry is processed, must also be of lower cost and higher quality. Generally, the circuitry is formed on a surface of the substrate through a photolithographic process. It is highly desirable to control the thickness of the silicon layer of a Silicon On Insulator (SOI) substrate, for example, or to control the total thickness variation (TTV) of a silicon substrate since a photolithographic tool must be refocused in each field to match the substrate's varying surface height. This is often a time-consuming and costly process which is directly attributable to the poor thickness control of a conventional mechanically polished wafer substrate.

Recently a Plasma Assisted Chemical Etching (PACE) process has been used to etch or "figure" the upper surface of the substrate after the prior rough mechanical cutting and polishing steps. The PACE process uses an electrode which is positioned above the silicon wafer substrate. Radio frequency (RF) power is fed to the electrode and through a positioning table supporting the wafer. A gas then flows through the electrode where it is ionized and generates a chemically reactive plasma species which is then discharged onto the top surface of the wafer. This discharge chemically figures the surface of the wafer to a predetermined depth.

Conventionally, a porous silicon carbide electrode is used in this PACE process. These electrodes have many open cell pockets therein such that the gas can pass completely through the electrode. While these porous silicon carbide electrodes create a good quality etched profile or "footprint" in the substrate, the electrode erodes relatively quickly and requires frequent replacement. Consequently, there is frequent down time for the PACE equipment which can be costly. Furthermore, particulates often erode off of the silicon carbide electrodes which can contaminate the surface of the wafer.

Another electrode which has been experimentally used in the past is known as a "showerhead" design. The showerhead design is used with solid non-porous electrodes which may be made from stainless steel or other metal. Therefore, many small diameter vertical holes must be drilled through the face of the electrode to allow passage of the inert gas. In order to prevent a secondary discharge from occurring within these holes (versus between the electrode and the substrate), they must have a diameter smaller than approximately 0.010 inches for the operating conditions commonly used. Furthermore, many of these holes are required in the electrode in order to replicate the desirable figuring footprint. Accordingly, it is very costly and difficult to drill these small holes through the thick electrode material. Therefore, while the silicon carbide and showerhead electrode designs illustrate improvements in the art, the cost and processing problems still exist.

SUMMARY OF THE INVENTION

In accordance with the present invention, the preferred embodiment of an electrode for use in a Plasma Assisted Chemical Etching process has an inner member surrounded by an outer member defining a gap therebetween such that a gas can flow therethrough. The inner member and the surrounding outer member further have a ducting system therein which is connected to the gap. This design creates a satisfactory figured footprint in a silicon wafer substrate equivalent to the quality of a porous silicon carbide electrode in a silicon wafer substrate.

In the preferred embodiment, a vertical duct is bored within the inner member and extends downward to a plurality of transversely oriented passages. These passages, in turn, intersect the annular gap. Thus, the gas flows through the duct, the passages, the annular gap and onto a top surface of the silicon wafer substrate. In an alternate embodiment, a ducting system is bored into the inner member and extends from the top surface thereof directly to the annular gap. Accordingly, the present invention electrode has a significantly longer useful life than does the porous silicon carbide electrodes of the prior art. Thus, there is less equipment and process down time for electrode replacement. Furthermore, the electrode of the present invention is significantly less costly to produce than is the prior art showerhead electrode design.

Additional advantages and features of the present invention will become apparent from the following description and the appended claims, taken in conjunction with the accompanying drawings.

BRIEF DESCRIPTION OF THE DRAWINGS

FIG. 4 is a graphical representation of an etched footprint in a silicon wafer substrate made by the present invention electrode of FIGS. 1-3;

FIG. 7 is a vertical sectional view of a third embodiment of the present invention electrode, similar to FIG. 2.

DETAILED DESCRIPTION OF THE PREFERRED EMBODIMENT

Figure 1:
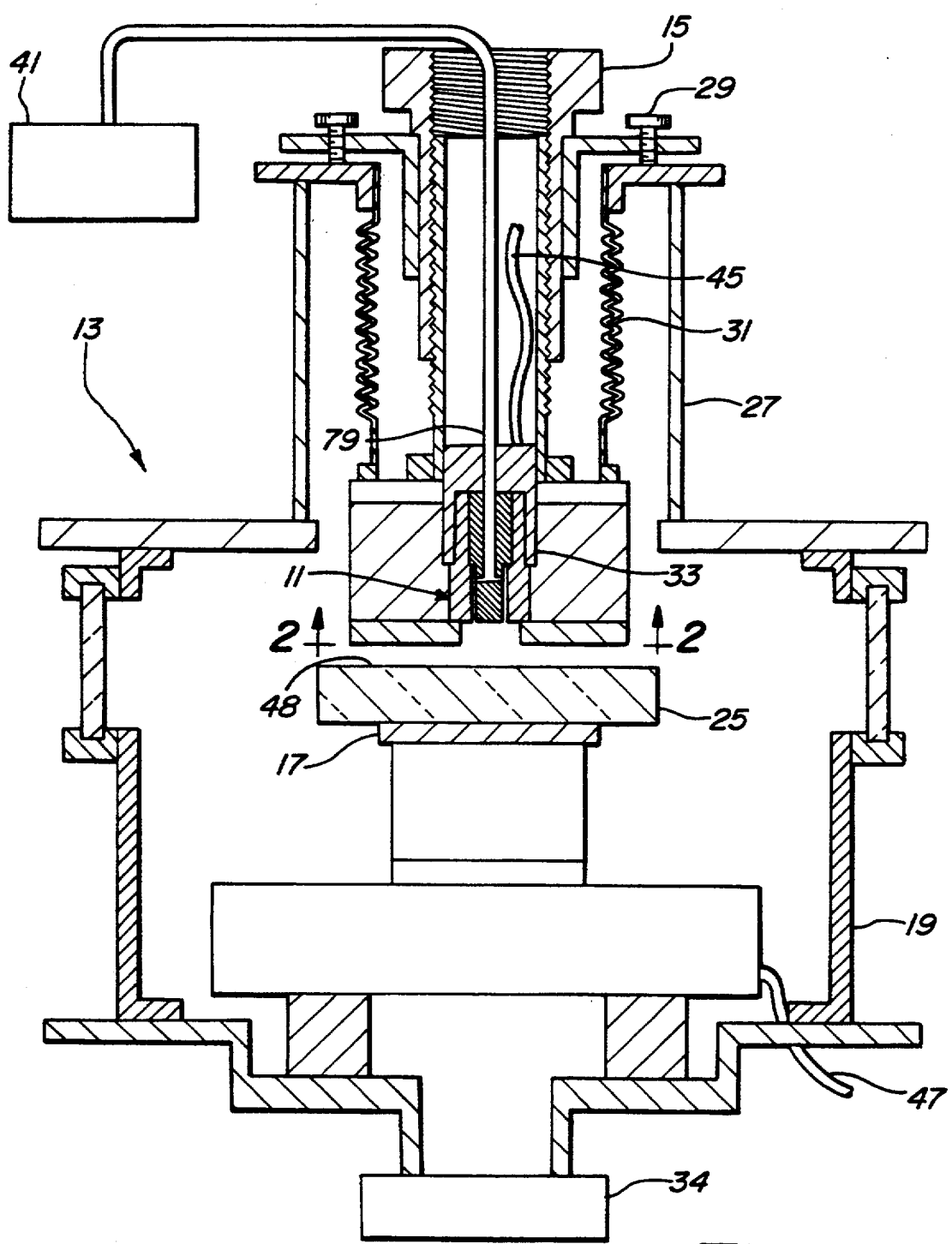
FIG. 1 is a vertical sectional view showing a first preferred embodiment of the present invention electrode in relation to a Plasma Assisted Chemical Etching reactor.

In accordance with the present invention, the preferred embodiment of an electrode 11 can be used in a Plasma Assisted Chemical Etching (PACE) process. The equipment required to run the PACE process can best be observed in FIG. 1. A Precision Materials PACE Reactor 13 comprises an electrode supporting structure 15 mounted above a computer controlled X-Y positioning table 17, both of which are located within an enclosed structure 19. A silicon wafer substrate 25 is fastened upon the top of positioning table 17. Such a substrate 25 may be a Silicon-on-Insulator (SOI) substrate such as an ACUTHIN wafer which is a trademark of Hughes Danbury Optical Systems, Inc. Electrode supporting structure 15 is retained within enclosed structure 19 through an upper mounting fixture 27 and a height and tilt adjustment mechanism 29. Furthermore, electrode supporting structure 15 is sealed within upper fixture 27 by a set of bellows 31 juxtapositioned therearound. An aluminum holder 33 is fastened to the bottom of electrode supporting structure 15 and serves to retain electrode 11. Furthermore, a vacuum pump 34 pulls a relatively mild vacuum, in the range of 1 to 10 Torr, within structure 19.

Figure 3:
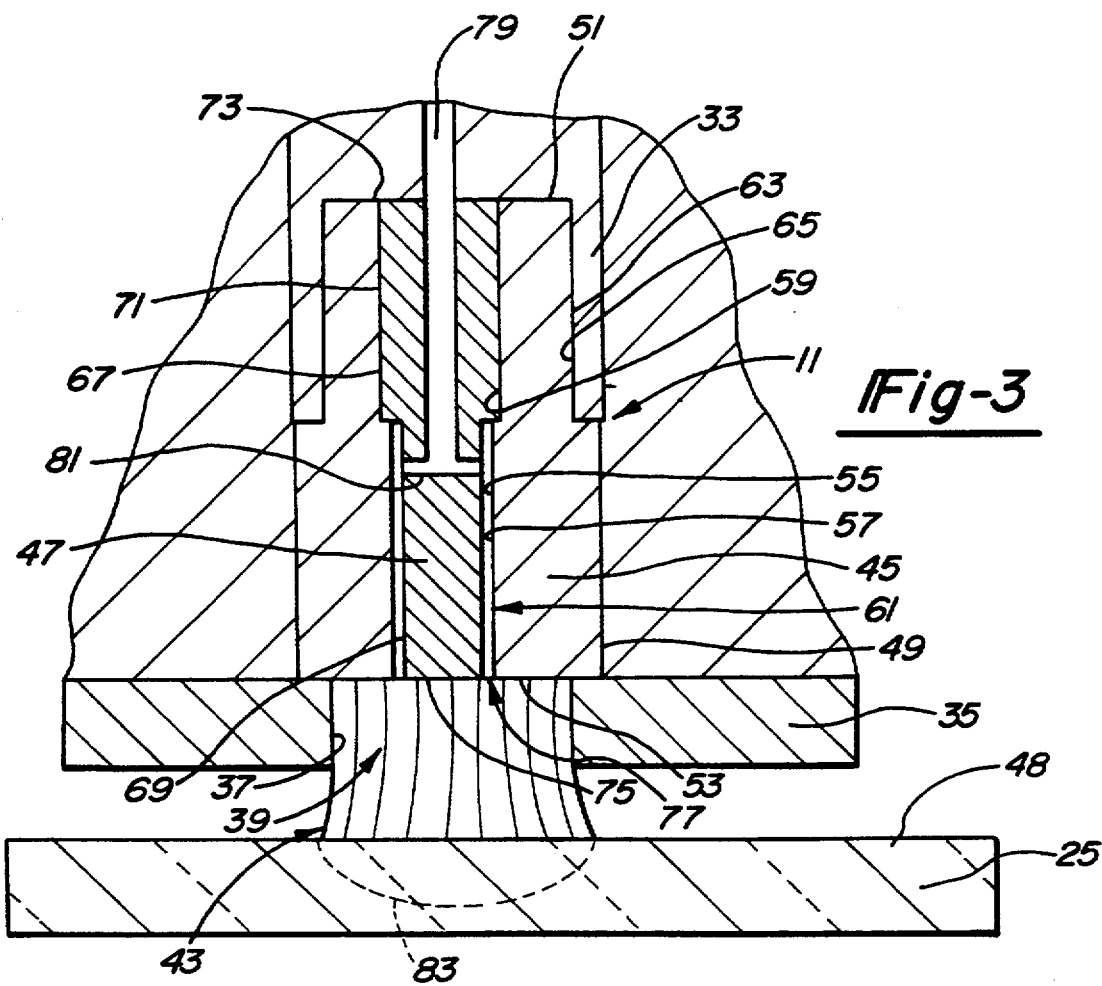
FIG. 3 is a vertical sectional view of the present invention electrode, taken along line 3—3 in FIG. 2.

Referring to FIGS. 1 and 3, a substantially horizontal member, known as a chimney 35, is mounted adjacent to the bottom of electrode 11. Chimney 35 is made from a fused silica material and has a vertical circular edge 37 which defines a centrally located aperture 39 therein; such a chimney is known to one skilled in the art. Circular edge 37 acts to control the shape of a plasma discharge 43 which flows from electrode 11. Furthermore, chimney 35 snugly fits against the bottom surface of electrode 11 thereby preventing a secondary discharge.

A gas source 41 is connected to electrode 11 and contains a pressurized inert gas such as sulphur hexaflouride. Radio frequency (RF) power is directly coupled to electrode 11 and substrate 25 through positive RF wire 45 and negative RF wire 47. This creates an ionized chemically reactive fluorine species from the inert gas which then forms plasma discharge 43 between electrode 11 and substrate 25. Therefore, a top surface 48 of substrate 25 is in contact with plasma discharge 43 and is subject to a low energy ionic flux of less than 10 eV.

Figure 2:
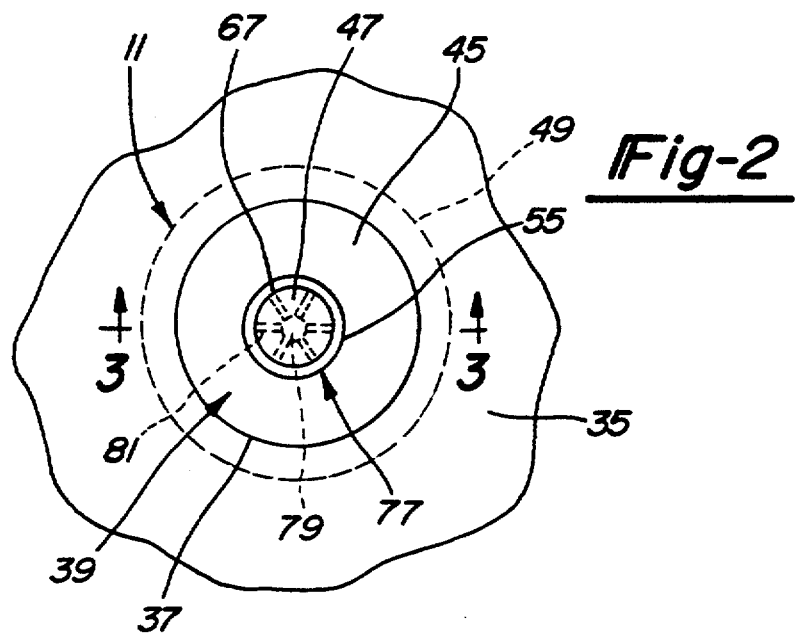
FIG. 2 is a bottom elevation view of the present invention electrode, taken along line 2—2 in FIG. 1.

Referring to FIGS. 2 and 3, the present invention electrode 11 is comprised of an outer member 45 which concentrically surrounds an inner member 47. Outer member 45 has a cylindrical outside surface 49 bordered by a flat top surface 51 and a flat bottom surface 53. Outer member 45 further has an inside surface 55 which is comprised of a lower portion 57 and an upper outwardly stepped portion 59, both of which are cylindrically shaped. Both portions 57 and 59 of inside surface 55 define a cavity 61 therein. Cavity 61 vertically extends from top surface 51 to bottom surface 53. Moreover, outside surface 49 of outer member 45 has an upper inwardly stepped portion 63 which fits within a cup-shaped portion 65 of holding device 33 by an interference press fit.

Inner member 47 has an outside surface 67. Outside surface 67 is comprised of a lower portion 69 which is cylindrically-shaped and an upper outwardly stepped portion 71 which is also cylindrically-shaped. Inner member 47 is further bordered by a flat top surface 73 and a flat bottom surface 75. Top surface 73 and bottom surface 75 of inner member 47 are substantially coplanar with top surface 51 and bottom surface 53 of outer member 45. Lower portion 69 of the inner member's outside surface 67 is spatially juxtapositioned inward from lower portion 57 of the outer member's inside surface 55 thereby defining an annular gap 77 therebetween. Moreover, upper outwardly stepped portion 71 of inner member 47 is compressibly located within outwardly stepped portion 59 of outer member 45 by an interference press fit. This serves to retain inner member 47 to outer member 45. Both outer member 45 and inner member 47 are made from 99.9% pure magnesium which can be procured from Spectralite Corporation of Madison, Ill. Use of a magnesium electrode provides a longer useful life than the porous silicon carbide electrodes of the prior art. In the presence of fluorine gas, the magnesium quickly becomes passivated with a magnesium fluoride coating, which is quite unreactive and increases the electrode life and reduces down time.

In the first preferred embodiment, a vertically oriented duct 79 is drilled centrally within inner member 47. Duct 79 intersects a plurality of passages 81 drilled transversely through inner member 47. Passages 81 are located approximately midway between upper surface 73 and bottom surface 75 of inner member 47. Furthermore, passages 81 extend radially outward from duct 79 and intersect with annular gap 77. Annular gap 77 should be as large as possible without causing a secondary discharge therewithin; it has been found that a 0.0010 to 0.0050 inch gap is adequate. Thus, the inert gas can flow down duct 79, through passages 81 and down annular gap 77. Accordingly, the aforementioned conduit system can be cost effectively produced within a solid non-porous electrode 11.

Plasma discharge 43 figures or etches a footprint 83 within top surface 48 of substrate 25. The figuring strategy uses a close overlap of successive sweeps of plasma discharge 43 thereby creating an overlapping ripple pattern to remove a layer of silicon material from top surface 48 of substrate 25. The depth of footprint 83 can be controlled by changing the velocity of the positioning table's movement under electrode 11. The gas flow rates and RF power have been found to be similar to that used with the prior art electrodes. FIG. 4 illustrates a typical figuring footprint created by the present invention electrode 11. As is known to one skilled in the art, the footprint 83 displayed in this graph is of good quality and is substantially similar to that measured by using the prior art porous silicon carbide electrode.

Figure 5:
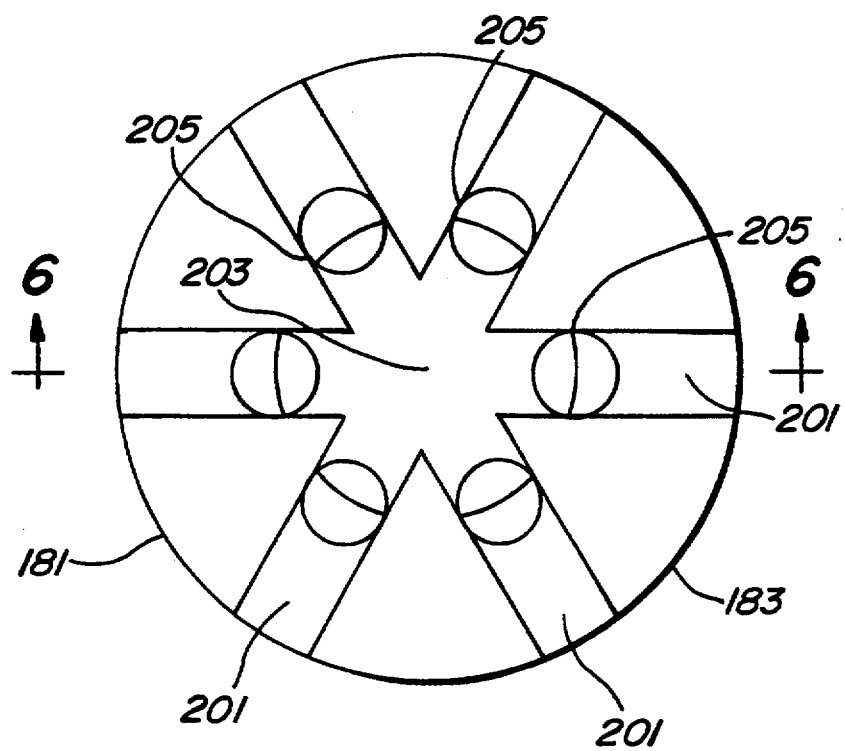
FIG. 5 is a top elevation view showing an inner member of a second preferred embodiment of the present invention electrode used in combination with the outer member and Plasma Assisted Chemical Etching reactor of FIGS. 1-3.
Figure 6:
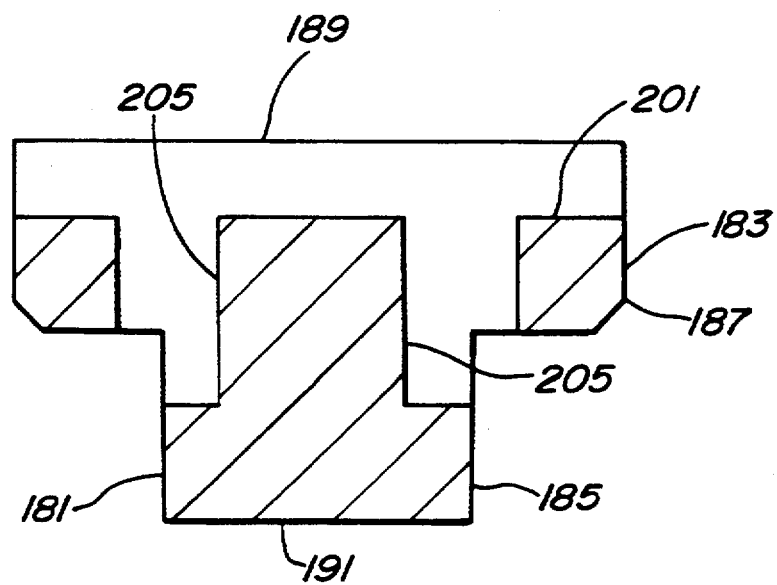
FIG. 6 is a vertical sectional view showing the inner member of the second preferred embodiment of the present invention electrode from FIG. 5.

An inner member 181 of a second preferred embodiment of the present invention PACE electrode is shown in FIGS. 5 and 6. Inner member 181 has an outside surface 183 defined by a lower portion 185 and an upper outwardly stepped portion 187. Inner member 181 is press fit with outer member 45 (see FIGS. 2 and 3) of the first embodiment. However, inner member 181 has a unique gas ducting system. A plurality of outwardly radiating grooves 201 are cut within a top surface 189 of inner member 181. These grooves 201 intersect each other at a center point 203. Furthermore, a conduit 205 is drilled downward in each groove 201 such that each conduit 205 intersects annular gap 77 (see FIGS. 2 and 3). This method prevents burrs from being created by drilling passage 81 (see FIG. 3) within outside surface 67 (see FIG. 3) of the first preferred embodiment inner member 47; any such burrs may hinder the fit of the members.

A third embodiment of the present invention electrode 85 is shown in FIG. 7. This electrode 85 has an inner member 87, an outer member 88, a peripheral member 89 and two annular gaps. Inner member 87 has an outside surface 90 bordered by a top surface 91 and a bottom surface 93. Outside surface 90 of inner member 87 has a lower portion 95 and an upper outwardly stepped portion 97, both of which are cylindrically-shaped.

Outer member 88 has an outside surface 101, a flat top surface 103 and a flat bottom surface 105. Outside surface 101 is comprised of a cylindrical lower portion 107 and a cylindrical upper outwardly stepped portion 109. Outer member 88 further has an inside surface 111 comprised of a lower portion 113 and an upper outwardly stepped portion 115, both of which are cylindrically-shaped and define a vertically oriented cavity 117 therein. Upper outwardly stepped portion 97 of inner member 91 snugly fits within upper outwardly stepped portion 115 of outer member 88. Lower portion 95 of inner member 87 and lower portion 113 of outer member 88 define a first annular gap 119 therebetween.

Peripheral member 89 concentrically surrounds outer member 88. Peripheral member 89 is comprised of a cylindrically-shaped outside surface 123 having an upper inwardly stepped portion 125 thereupon. Furthermore, upper inwardly stepped portion 125 fits within a cup-shaped portion 126 of a holding device 127 by an interference press fit. Also, peripheral member 89 is comprised of a flat top surface 129, a flat bottom surface 131 and an inside surface 133. Inside surface 133 forms a vertically oriented cavity 135 therein and has a cylindrically-shaped lower portion 137 and a cylindrically-shaped upper outwardly stepped portion 139. Upper outwardly stepped portion 109 of the outer member's outside surface 101 fits tightly within upper outwardly stepped portion 139 of the peripheral member's inside surface 133. Top surfaces 91, 103 and 129 are substantially coplanar. Similarly, bottom surfaces 93, 105 and 131 are also substantially coplanar. Moreover, lower portion 107 of the outer member's outside surface 101 and lower portion 137 of the peripheral member's inside surface 133 define a second annular gap 141 therebetween.

The ducting system of either the first or second preferred embodiments can be used in combination with this third embodiment. Using the first ducting construction, a vertical duct 143 is centrally drilled within inner member 87 and intersects a plurality of transversely oriented passages 145. Passages 145 radially extend outward from duct 143 and intersect first annular gap 119. Outer member 88 similarly has a plurality of passages 147 cut transversely therethrough. Passages 147 connect first annular gap 119 with second annular gap 141. Therefore, the gas can flow from source 41 (see FIG. 1) through duct 143, through passages 145 and 147, and can exit from annular gaps 119 and 141. Alternatively, the second ducting pattern can be used such that grooves (not shown) and conduits (not shown) may be cut within top surfaces 91 and 103 of inner and outer members, respectively 87 and 88. In this scenario, it is helpful to have a circular groove (not shown) cut in top surface 103 of outer member 88 adjacent to inside surface 111. This circular groove intersects with outwardly radiating grooves 201 (see FIGS. 5 and 6) so that inner and outer members, 87 and 88 respectively, do not have to be circumferentially aligned with one another. It would be obvious to one skilled in the art that the number of concentric annular gaps and coincident electrode members may be multiplied infinitely.

While various embodiments of the present invention electrode for use in a Plasma Assisted Chemical Etching process have been disclosed, it will be appreciated that various modifications may be made without departing from the present invention. Accordingly, this electrode design would apply to any plasma process where it is advantageous to introduce gas through the electrode. Also, this electrode and PACE process can be used for many other semi-conductor applications as well as for a variety of optical material substrates where thickness control or shaping of a surface is desired. Furthermore, while a specific electrode shape has been described, a non-cylindrical electrode may also be used in a similar manner without departing from the scope of this invention. Various materials have been disclosed in an exemplary fashion, however, various other materials may of course be employed. For instance, the electrode of the present invention may be produced from solid non-porous materials other than magnesium. It is intended by the following claims to cover these and any other departures from the disclosed embodiments which fall within the true spirit of this invention.

The invention claimed is:

1. An electrode for use in a Plasma Assisted Chemical Etching process for etching a figurable substrate, said electrode comprising:

an outer member having an outside surface bordered by a top surface and a bottom surface, said outer member further having an inside surface thereof which defines a vertically oriented cavity therein, said cavity extending from said top surface to said bottom surface, said inside surface of said outer member having a lower portion thereof;

an inner member having an outside surface bordered by a top surface and a bottom surface, said outside surface of said inner member further having a lower portion thereof, said inner member having a ducting system bored therein which extends from said top surface thereof to said outside surface therethrough;

said inner member nesting within said cavity of said outer member such that said lower portion of said outer member's inside surface and said lower portion of said inner member's outside surface define a vertically oriented gap therebetween which extends downward to said bottom surfaces of said inner and outer members; and gas source means for flowing a gas through said ducting system of said inner member and through said gap defined between said inner and outer members and onto said figurable substrate.

2. The electrode of claim 1 wherein said outside surface of said inner member is cylindrically-shaped and said inside surface of said outer member is cylindrically-shaped, with said gap defined therebetween being annular in shape.

3. The electrode of claim 2 further comprising:

a holding device having a cup-shaped portion; and said outside surface of said outer member having a cylindrical cross sectional shape thereto with an upper inwardly stepped portion thereabove, said inwardly stepped portion being attached within said cup-shaped portion by an interference press fit.

4. The electrode of claim 2 wherein said outside surface of said inner member has an outwardly stepped portion located above said lower portion, said outwardly stepped portion is attached within a corresponding upper outwardly stepped portion of said inside surface of said outside member by an interference press fit, said outwardly stepped portion of said inner member is juxtapositioned above said annular gap and encloses the top thereof.

5. The electrode of claim 2 further comprising:
a chimney member having a horizontal portion with a circular edge thereof defining a circular aperture which extends centrally therethrough and being concentric with said annular gap, whereby said chimney element confines a plasma discharge created by said gas.

6. The electrode of claim 1 wherein said top and bottom surfaces of said outer member and said top and bottom surfaces of said inner member are substantially coplanar to one another.

7. The electrode of claim 1 wherein said ducting system further comprises:
said inner member having a duct vertically extending therein from said top surface to at least one passage located therethrough, said passage being positioned transversely between said top and bottom surfaces of said inner member and extending radially outward from said duct to said outside surface of said inner member.

8. The electrode of claim 1 wherein said ducting system further comprises:
a plurality of outwardly radiating grooves being located within said top surface of said inner member and said plurality of grooves intersecting each other centrally thereto; and
a conduit being positioned within each end of said plurality of grooves such that each conduit extends substantially downward to intersect said gap.

9. The electrode of claim 1 wherein said inner member and said outer member are magnesium.

10. The electrode of claim 1 further comprising:
a peripheral member having an outside surface bordered by a top surface and a bottom surface, said peripheral member further having an inside surface defining a vertically oriented cavity therewithin, said inside surface of said peripheral member also having a lower portion thereof,
said outside surface of said outer member having a lower portion thereof, said outer member having a ducting system therein;
said inside surface of said peripheral member being juxtapositioned around said outside surface of said outer member such that said lower portion of said peripheral member's inner surface and said lower portion of said outer member's outside surface define a vertically oriented second gap therebetween; and
said gas source means flowing said gas through said first gap and through said second gap onto said figurable substrate.

11. The electrode of claim 10 wherein said outside surface of said inner member is cylindrically-shaped, said inside surface of said outer member is cylindrically-shaped, said outside surface of said outer member is cylindrically-shaped and said inside surface of said peripheral member is cylindrically-shaped, said first and second gaps defined therebetween are annular in shape.

12. The electrode of claim 10 wherein said ducting system further comprises:
said outer member having at least one passage therethrough located transversely between said top surface and said bottom surface of said outer member; and
said passage of said outer member extending radially outward from said first gap to said second gap.

13. An electrode for use in a Plasma Assisted Chemical Etching process for etching a figurable substrate, said electrode comprising:
an outer member having an outside surface bordered by a substantially flat top surface and a substantially flat bottom surface, said outside surface of said outer member having a cylindrical cross sectional shape thereof with an upper inwardly stepped portion thereabove, said outer member further having a cylindrically-shaped inside surface which defines a vertically oriented cavity therein, said cavity extending from said top surface to said bottom surface, said inside surface of said outer member having a lower portion with an outwardly stepped portion located thereabove;
an inner member having a cylindrically-shaped outside surface bordered by a substantially flat top surface and a substantially flat bottom surface, said outside surface of said inner member having a lower portion with an outwardly stepped portion located thereabove, said outwardly stepped portion of said inner member's outside surface being attached within said corresponding upper outwardly stepped portion of said outside member's inside surface by an interference press fit, said outwardly stepped portion of said inner member being juxtapositioned above said annular gap and enclosing the top thereof, said inner member further having a duct vertically extending therein from said top surface to at least one passage located therethrough, said passage being positioned transversely between said top and bottom surfaces of said inner member and extending radially outward from said duct to said outside surface of said inner member;
said inner member fitting concentrically within said cavity of said outer member such that said lower portion of said outer member's inside surface and said lower portion of said inner member's outside surface define a vertically oriented annular gap therebetween which extends downward to said bottom surfaces of said inner and outer members, said top and bottom surfaces of said outer member and said top and bottom surfaces of said inner member being substantially coplanar to one another, said bottom surface of said outer member, said bottom surface of said inner member and said gap defined therebetween being directed toward a top surface of said figurable substrate; and
a gas source means for flowing a gas through said duct and said passage of said inner member and through said gap defined between said inner and outer members and onto said figurable substrate.

14. A method for using an electrode used in a Plasma Assisted Chemical Etching process to etch a figurable substrate, said method comprising:
(a) creating a ducting system within an inner member, said inner member having an outside surface with a lower portion thereof;
(b) creating a vertically oriented cavity centrally within an outer member, said cavity being defined by an inside surface of said outer member, said inside surface having a lower portion thereof;
(c) fitting said inner member within said cavity of said outer member such that said lower portion of said inner member's outside surface and said lower portion of said outer member's inside surface define a gap therebetween;

(d) mounting a figurable substrate below said bottom surfaces of said inner and outer members; and (e) flowing a gas through said ducting system of said inner member and through said gap defined between said inner and outer members and onto said figurable substrate.

15. The method of claim 14 wherein said outside surface of said inner member is cylindrically-shaped and said inside surface of said outer member is cylindrically-shaped, said gap defined therebetween is annular in shape.

16. The method of claim 15 wherein said outside surface of said inner member has an outwardly stepped portion located above said lower portion, said outwardly stepped portion is attached within a corresponding upper outwardly stepped portion of said inside surface of said outside member by an interference press fit, said outwardly stepped portion of said inner member is juxtapositioned above said annular gap and encloses the top thereof.

17. The method of claim 14 wherein the method for producing said ducting system further comprises:

(a) creating a vertically oriented duct centrally within said inner member; and (b) creating at least one passage within said inner member, said passage extending transversely therethrough and intersecting said duct centrally thereto.

18. The method of claim 14 wherein the method for producing said ducting system further comprises:

(a) creating a plurality of outwardly radiating grooves within said top surface of said inner member, said grooves intersecting each other centrally thereto; and (b) creating a conduit within each end of said plurality of grooves, said conduits extending substantially downward from each of said plurality of grooves to said gap.

19. The method of claim 14 wherein said figurable substrate is a silicon electronic wafer.

20. The method of claim 14 wherein said figurable substrate is an optical device.

21. An improved electrode for use in a plasma assisted chemical etching process for etching a figurable substrate, the improvement comprising:

a magnesium electrode member.

22. A method of etching a figurable substrate, the method including the steps of:

providing a gas plasma;

providing a magnesium electrode member; and flowing said gas plasma through said electrode member onto said substrate to etch said figurable substrate.

23. An improved system of the type using an electrode and a plasma gas for etching a figurable substrate, the improvement comprising:

an electrode member made of a material selected to interact with said plasma gas to enhance the useful life of the electrode.

24. The invention of claim 23 wherein the electrode member is an almost pure element.

25. The invention of any of claims 21, 22 and 24 wherein the electrode member is almost pure magnesium.

26. A method of etching a figurable substrate, said method including the steps of:

providing a gas plasma;

providing an electrode member made of a material which becomes passivated by said gas plasma to increase the durability of said electrode; and flowing said gas through said electrode to etch said figurable substrate.

* * * * *